United States Patent
Calvo-Munoz et al.

(10) Patent No.: US 8,324,104 B2
(45) Date of Patent: Dec. 4, 2012

(54) SURFACE TREATMENT IN SEMICONDUCTOR MANUFACTURING

(75) Inventors: Maria Luisa Calvo-Munoz, Grenoble (FR); Janos Farkas, Saint Ismier (FR)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 12/934,277

(22) PCT Filed: Apr. 11, 2008

(86) PCT No.: PCT/IB2008/053124
§ 371 (c)(1),
(2), (4) Date: Sep. 24, 2010

(87) PCT Pub. No.: WO2009/125255
PCT Pub. Date: Oct. 15, 2009

(65) Prior Publication Data
US 2011/0021024 A1    Jan. 27, 2011

(51) Int. Cl.
*H01L 21/4763* (2006.01)
*H01L 21/44* (2006.01)

(52) U.S. Cl. ......... 438/687; 438/618; 438/624; 438/622

(58) Field of Classification Search .................. 438/622, 438/624, 626, 629, 633, 648, 650, 686, 687, 438/694, 695, 902, 696, 692, 798, 652, 635, 438/618, 625; 257/E21.226, E21.229
See application file for complete search history.

(56) References Cited

U.S. PATENT DOCUMENTS

| | | | |
|---|---|---|---|
| 5,135,608 A * | 8/1992 | Okutani | 438/584 |
| 5,221,366 A | 6/1993 | Roberts et al. | |
| 6,878,628 B2 | 4/2005 | Sophie et al. | |
| 2002/0047144 A1 * | 4/2002 | Nguyen et al. | 257/295 |
| 2006/0003570 A1 | 1/2006 | Shanmugasundram et al. | |
| 2006/0148255 A1 | 7/2006 | Lu et al. | |
| 2007/0037389 A1 * | 2/2007 | Chen et al. | 438/678 |

OTHER PUBLICATIONS

A. Satta et al: "The Removal of Copper Oxides by Ethyl Alcohol Monitored In Situ by Spectroscopic Ellipsometry" Journal of the Electrochemical Society, 150 (5), 2003, pp. G300-G306.
International Search Report and Written Opinion correlating to PCT/IB2008/053124 dated Dec. 19, 2008.

* cited by examiner

*Primary Examiner* — Chuong A. Luu

(57) ABSTRACT

The present invention provides a process for forming a capping layer on a conducting interconnect for a semiconductor device, the process comprising: providing a substrate comprising one or more conductors in a dielectric layer, the conductors having an oxide layer at their surface; exposing the surface of the substrate to a vapor of β-diketone or a β-ketoimine; and depositing a capping layer on the surface of at least some of the one or more conductors. The present invention further provides an apparatus for carrying out this method.

24 Claims, 2 Drawing Sheets

SURFACE TREATMENT IN SEMICONDUCTOR MANUFACTURING

FIELD OF THE INVENTION

The present invention relates to the deposition of a capping layer on a conducting interconnect in a dielectric layer for a semiconductor device. More particularly, the present invention relates to the treatment of the conducting interconnect prior to the deposition of the capping layer.

BACKGROUND OF THE INVENTION

Semiconductor manufacturers are continuously striving to produce faster and more complex integrated circuits. The most direct way of achieving this is to reduce the dimensions of a semiconductor circuit, thereby decreasing the gate (transistor) delay. However, as the dimensions of circuits are reduced, in particular as the width of conducting interconnects contained in the circuit decreases, the electrical resistance of the interconnect is proportionately increased. This causes an increase in the gate delay and the loss of electrical energy through heat production.

In order to offset the side-effects of reducing circuit dimensions, materials with low bulk resistivity are used to manufacture the interconnects of the circuits. Copper is one such material. Its use is favoured because, as well as having low bulk resistivity, it also has a relatively high heat conductivity and melting point. However, like some other metals that can potentially be used as the material in interconnects, copper suffers from poor adhesion to dielectrics and copper has a tendency to be degraded by electromigration. These drawbacks may be overcome by depositing a thin capping layer, typically comprising an alloy, on the copper interconnects. The capping layer is also known as a passivation layer.

Techniques used to deposit the capping layer onto the interconnect are generally selective in nature, so that they deposit the capping layer onto the interconnect but not onto the dielectric surface. One such technique is electroless deposition. However, the selectivity and effectiveness of this deposition of the capping layer depends on the surface of the substrate being very clean. In other words, impurities or contaminants on or in the surface of either the dielectric layer or the interconnect result in reduced selectivity and effectiveness of the deposition.

One possible contaminant is an oxide layer at the surface of the interconnect. This oxide layer is usually spontaneously created during the formation of the interconnects. For example, a layer of copper oxide is formed at the surface of copper interconnects during Chemical Mechanical Polishing (CMP) of the interconnect, partly spontaneously through reaction with the atmosphere and partly a result of the chemical treatment during CMP.

In the past, any oxide contaminant formed prior to deposition of the capping layer has usually been removed by wet treatment of the surface of the substrate. The wet treatment typically involves washing with an aqueous acidic solution having a low pH, sometimes containing additives such as surfactants. This solution can successfully remove the layer of oxide at the surface to expose the surface of the un-oxidized interconnect. The acid treatment also removes other contaminants from the surface, such as metal residues and organic residues.

However, the inventors of the present invention have found that the current acid etching process is aggressive and it is not wholly selective for removing just the oxide; instead, a small but significant amount of the non-oxidized conducting interconnect is also etched. This is demonstrated in FIG. 1, which shows an interconnect after treatment with a conventional aggressive acid cleaning solution. This Figure demonstrates that conventional cleaning can result in the formation of a recess at the surface of the interconnect where material from the surface (both oxide and non-oxide) has been removed from the surface.

This formation of recesses results in a decrease in the cross-sectional area of the interconnect, thereby increasing its resistance. This in turn results in an increased amount of heat produced by the increased electrical resistance, and consequently increases the gate delay and rate of electromigration. Ultimately, this results in the reduced performance and a decreased lifetime of the transistor.

In view of the drawbacks of a conventional acid wash, the inventors have looked for improved methods of treating an oxidized surface prior to deposition of a capping layer. One potential method is described in US 2007/037389. This describes the treatment of the surface of a copper interconnect with an ethanol vapour prior to deposition of a capping layer. It is thought by the present inventors that this method results in the reduction of copper oxide at the surface of the interconnect by the following chemical reactions:

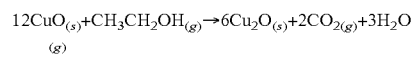

then:

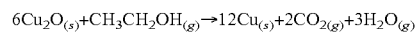

Accordingly, this method does not etch away the unwanted copper oxide; instead, it reduces the copper oxide into metallic copper. As a result, the present inventors have found that no recess tends to be formed by this method of etching.

However, the present inventors have also found that, because this method does not etch away any oxide but instead simply deposits the reduced metal onto the surface, it has a tendency only to treat the very top layers of metal oxide. This is because the reduced metal, once it has been deposited, in effect acts as a barrier preventing the reduction of the remaining part of the layer of metal oxide. This reduces the homogeneity of the interconnect and it may result in an increased level of electromigration in the interconnect. Any remaining copper oxide, even if not directly at the surface of the substrate, may also reduce the effectiveness and selectivity of the deposition of the capping layer.

SUMMARY OF THE INVENTION

According to an aspect of the present invention, there is provided a process for forming a capping layer on a conducting interconnect for a semiconductor device as recited in the appended claims.

According to another aspect of the present invention, there is provided an apparatus for depositing a capping layer on a conducting interconnect as recited in the appended claims.

Specific embodiments of the invention are set forth in the dependent claims.

These and other aspects of the invention will be apparent from and elucidated with reference to the embodiments described hereinafter.

DESCRIPTION OF THE FIGURES

The following figures are provided by way of example to illustrate embodiments of the present invention.

DETAILED DESCRIPTION OF THE FIGURES

Figure 1:
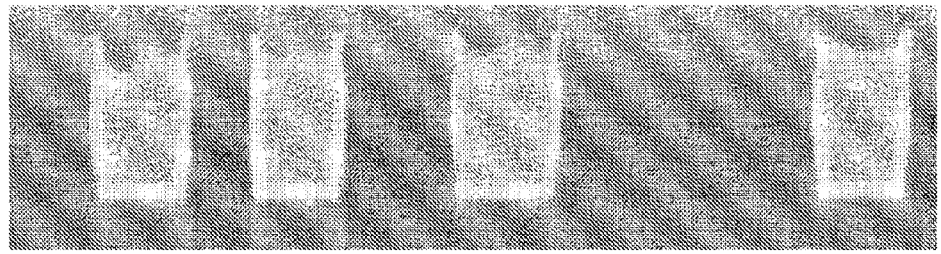
FIG. 1 shows the formation of recesses with using an aggressive acid clean.
Figure 2:
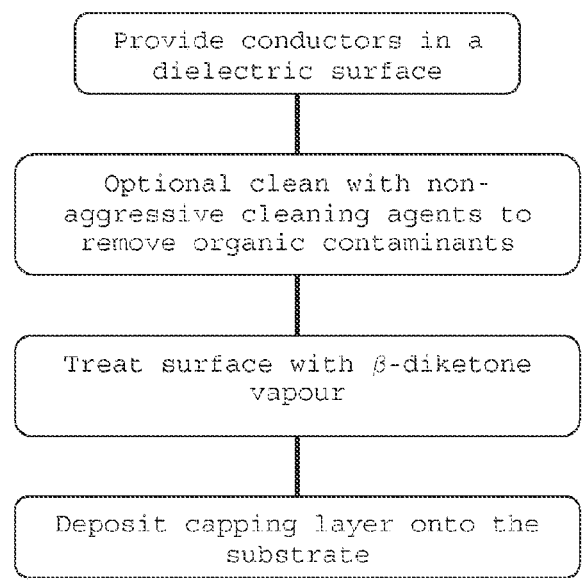
FIG. 2 shows a schematic showing an embodiment of the present invention.

The present invention is aimed at addressing at least some of the problems associated with the prior art. In particular, the present invention is aimed at providing an improved process for cleaning a conducting interconnect having oxide at its surface that effectively cleans the surface of the oxide but does not result in the formation of a significant recess at the surface of the interconnect.

Accordingly, in the present invention the surface of a conducting layer is treated with a β-diketone or β-ketoimine. The β-diketone or β-ketoimine typically has at least one hydrogen in the α-(alpha) position in between the two ketone groups (for the β-diketone) or in between the ketone and imine groups (for the β-ketoimine). In one embodiment, the invention involves the use of a β-diketone.

The β-diketones or β-ketoimines may have the following structure:

(1)

In this formula, $R_1$ is a hydrogen atom, a halogen atom (e.g. fluorine), or a substituted or unsubstituted, saturated or unsaturated alkyl group.

$R_2$ and $R_3$ may be the same or may be different. If they are the same, the synthesis of molecule (1) is generally simpler. Both $R_2$ and $R_3$ are substituted or unsubstituted, saturated or unsaturated alkyl groups.

Typically, Y is an oxygen atom. However, Y may also have the structure N—$R_4$. $R_4$ may be a substituted or unsubstituted, saturated or unsaturated alkyl group or have the formula:

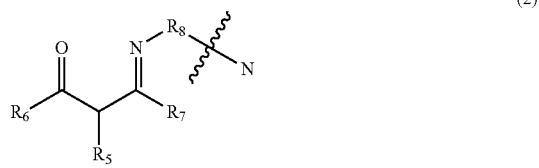

(2)

$R_5$ is a hydrogen atom, a halogen atom (e.g. fluorine), or a substituted or unsubstituted, saturated or unsaturated alkyl group. $R_6$ and $R_7$, which may be the same or may be different, are substituted or unsubstituted, saturated or unsaturated alkyl groups. $R_8$ is also a substituted or unsubstituted, saturated or unsaturated alkyl group.

As used herein, the term "alkyl group" refers to a group containing carbon and optionally hydrogen. Furthermore, the term "alkyl group" as used herein requires that the atom through which the alkyl group is attached to the rest of the molecule is a carbon atom. As a result, the carbonyl/imine groups shown in formula (1) above are ketone/imine groups and are not, for example, the carbonyl of an acid or aldehyde group (although the carbonyl groups may be conjugated to other functional groups through $R_2$, $R_3$, $R_6$ and $R_7$).

An alkyl group contains one or more carbon atoms. Typically, so that the molecule (1) is reasonably volatile, an alkyl group will contain up to eight carbon atoms, for example up to four carbon atoms. The alkyl group may be linear or it may be branched.

The alkyl group may be entirely saturated or unsaturated, or contain both saturated and unsaturated parts. For example, the alkyl group may be or may comprise one or more aromatic (aryl) groups, such as one or more phenyl groups. phenyl. Examples of unsaturated alkyl groups having up to four carbon atoms include methyl, ethyl, n-propyl, iso-propyl, n-butyl, sec-butyl, tert-butyl.

The alkyl group may be unsubstituted, or it may be substituted by one or more heteroatoms. For example, the alkyl group may be completely substituted. Suitable substituents include fluorine, chlorine, bromine, iodine, silicon, nitrogen, phosphorus and oxygen. Substituents such as silicon, nitrogen, phosphorus and oxygen are themselves be substituted, either by hydrogen (e.g. for nitrogen and oxygen), by other heteroatoms (e.g. phosphorus substituted with oxygen), or by substituted or unsubstituted alkyl groups.

In one embodiment, the alkyl group, which typically comprises 1 to 4 carbon atoms, is partially or fully substituted with halogen atoms with no other substituents. In particular, the inventors have found that the present invention works well if the alkyl group is partially or fully substituted with fluorine.

In one particular case that the inventors have found is particularly suited to carrying out the present invention, the substrate is treated with:

(3)

In particular:

(4)

In (3) and (4), $R_1$, $R_2$ and $R_3$ are typically independently selected to be alkyl groups having one to four carbons. Optionally, one or more of the alkyl groups (e.g. all of the alkyl groups) may be substituted by only halogen atoms. For example, one or more of the alkyl groups (e.g. all of the alkyl groups) may be substituted by only fluorine atoms. This substitution may be partial or it may be complete.

A molecule that is particularly suited for carrying out the present invention is:

(5)

This is 1,1,1,5,5,5-hexafluoro-2,4-petanedione (1,1,1,5,5,5-hexafluoroacetylacetone). Other specific examples of molecules that may be used in the present invention include 1,1,1,-trifluoro-2,4-pentanedione, 2,2,6,6-tetramethyl-3,5-heptanedione and 1,1,1,5,5,6,6,7,7,7-decafluoro-2,4-heptanedione.

The β-diketone or β-ketoimine is provided in vapour form. Unlike ethanol vapour, β-diketones and β-ketoimines are not thought to exclusively reduce the oxide at the surface of the interconnect to metal; instead, β-diketones and β-ketoimines are thought to partially etch away the layer of oxide. This process is illustrated below for a β-diketone acting on a copper oxide layer (the various R groups are not necessarily identical to one another):

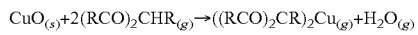

Copper(I) oxide is converted into a mixture of solid and gaseous copper:

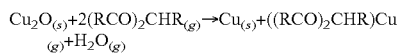

Accordingly, while copper(II) oxide is thought to be converted into mostly a volatile copper compound, copper(I) oxide is thought to be converted into a mixture of gaseous and solid copper. As a result, a proportion of the metal is typically re-deposited onto the surface of the substrate, while the rest of the metal is removed under vacuum in gaseous form. This balance of removal of oxidized metal and re-deposition of the reduced metal allows for an effective treatment process that has the potential to treat all of the metal oxide at the surface of the substrate. At the same time, the process allows a proportion of the metal to be re-deposited onto the surface, reducing the recess formed at the surface of the substrate compared to an exclusively etching process.

This reaction mechanism that results in a mixture of removal and re-deposition is a result of using a β-diketone or a β-ketoimine. This reaction mechanism is not thought to operate for other species: for example, it is not thought to operate for alcohols, aldehydes or acids, which are thought to operate in the same way illustrated above for ethanol, i.e. by exclusive re-deposition of the metal onto the surface of the substrate.

Furthermore, the inventors have found this process to be selective. This is because, when the treatment process is carried out in a non-oxidizing atmosphere (i.e. under conditions in which the metal does not react to form the metal oxide), the oxidized interconnect is etched whereas the un-oxidized interconnect is not etched. However, if the process were to be carried out in an oxidizing atmosphere and if the process were not to be carefully controlled, the metal surface would continuously be oxidized or re-oxidized to its oxide. The newly-formed metal oxide would then be etched from the surface. As a result, the metal surface itself is etched in an oxidizing atmosphere unless the etching time is very carefully controlled. This unselective etching is described in, for example, U.S. Pat. No. 5,221,366.

The selectivity of the process of the present invention contributes to a reduction in the size of the recess formed at the surface of the interconnect compared to an etching process that also etches the un-oxidized interconnect surface, such an aggressive treatment with an aqueous strong acid.

Non-oxidizing conditions that enhance selectivity may be provided in an oxygen-free system (i.e. in an atmosphere that contains no oxygen). For example, the atmosphere may contain 10 parts per million or less (in terms of volume) of oxygen, for example 1 part per million or less).

In order to vaporize molecule (1), a bubbler is typically used. In the bubbler, a carrier gas (such as argon or nitrogen) is bubbled through a liquid sample of (1). The carrier gas becomes saturated with the vapour of (1). The partial pressure of (1) in the carrier gas will depend on the temperature of the liquid. For example, (3) has a partial pressure of 11.3 kPa (85 Torr) at 20'C.

The skilled person will recognise that there are alternative ways of vaporizing (1). For example, (1) may be vaporized simply by heating. However, the use of a bubbler allows for a convenient way of producing a vapour of (1) in a carrier gas.

Suitable gases for use as carrier gases (with or without the use of a bubbler) include inert gases such as the noble gases (including helium, neon and argon) and nitrogen.

Before vaporized (1) is injected into the chamber, it is typically heated to between about 20° C. and about 100'C. During treatment, the substrate typically temperature has a temperature in the range between 100 and 500° C. More typically, the substrate is heated to 130 to 300° C.

Once vaporized, (1) is then exposed to the surface of the substrate. The substrate typically comprises one or more conductors in a dielectric layer. The one or more conductors (interconnects) may comprise Cu or an alloy thereof. Alternatively, or in conjunction, Ag or an alloy thereof may be used. As described later, the conductors may also comprise an activation layer, such as a palladium activation layer at the surface of the substrate. The dielectric layer may comprise an oxide of silicon or a carbonated oxide of silicon. Suitable examples include silicon dioxide or carbonated silicon dioxide. The dielectric layer may be a porous or non-porous layer.

The substrate will have typically been subject to chemical mechanical polishing. Before is treated with the vapour of (1), the substrate may be treated with a cleaning agent. When appropriate, this cleaning agent may be used by itself without any other cleaning steps. Examples of such cleaning agents include an aqueous acidic solution having a pH of 4 or less. The solution may also contain:

(i) One or more surfactants. Suitable examples include polyethylene glycol, polyethylene glycol-polypropylene glycol block co-polymers (for example the 'tetronic' or 'pluronic' surfactants available from BASF), and/or fluorinated surfactants (for example, perfluorooctanoic acid and its derivatives, such as those commercialized by Dupont under the trade name 'Zonyl').
  (ii) One or more chelating agents and/or complexing agents. Suitable examples include carboxylic acid- or carboxylate-containing compounds or derivatives thereof, for example citric acid, oxalic acid or/and malic acid.
  (iii) Optionally one or more pH-adjusting agents. Suitable examples include organic acids, for example up to about 0.25M methanesulfonic acid.
  (iv) Optionally one or more oxidizing agents, for example ammonium persulfate For (iii) and (iv) if present, the organic acid concentrations is typically between 1 and 20 g/l and the ammonium persulfate concentration is typically from 1 to 20 g/l. For (i), the surfactants are typically present in a total amount of 1 to 200 ppm. (It is to be noted that the use of this cleaning agent by itself without subsequent treatment with a β-diketone or β-ketoimine is contemplated, but its use in combination with a β-diketone or β-ketoimine is advantageous because the formation of recesses at the surface of the interconnect can be reduced).

However, one advantage of the present invention is that it can be used without any other cleaning steps. In particular, unless necessary, the present invention takes the place of an aggressive cleaning step such as treatment with strong acid solution. This is advantageous because it can further reduced the formation of recesses at the surface of the interconnect).

During treatment with (1), the surface of the substrate may be heated to 100 to 500'C, for example 150 to 400'C, such as 170 to 250'C. This temperature allows the volatile copper-containing molecules to desorb from the surface and be removed. The substrate may also be exposed to radiation during treatment, for example UV radiation, to increase the rate of reaction.

(1) is typically introduced at a flow rate of between 2 to 40 sccm. If carried by a carrier gas, (1) is typically at a partial pressure of 11.3 kPa (85 Torr).

Once the surface has been exposed to (1), the system is typically placed under vacuum (e.g. at a pressure of 0.01 atm (1 kPa) or less, such as 0.001 atm (0.1 kPa) or less). This facilitates the removal of volatile copper-containing compounds from the surface and further prevents oxidation of the surface by any residual oxygen.

After exposure to (1) and desorption of any volatile copper species from the surface of the substrate, the substrate is then subject to electroless deposition. In order to prevent oxidation of the surface, the substrate remains in an oxygen-free atmosphere until after the electroless deposition. This can be conveniently achieved by carrying out both exposure to the β-diketone and electroless deposition in a single tool.

A capping layer is then deposited on top of the freshly-cleaned interconnect structure. The capping layer will typically comprise an alloy, for example a ternary alloy composition comprising, for example, one or more of Co, W, Sn, Ni and Mo. Suitable examples include CoWP, CoMoPB, CoWB, CoWPB, CoSnP and NiMoPB, NiMoP.

The capping layer is typically deposited by a process comprising electroless deposition. This involves placing the surface containing the interconnects into a solution of the salts of the various metals to be incorporated into the alloy capping layer. Surfactants can also be incorporated into the plating solution. The process is selective, so that the capping layer is essentially only deposited on the freshly-cleaned interconnect structure and not on the dielectric surface.

Accordingly, the overall process may comprise the following sequential steps:
chemical mechanical polishing of an interconnect;
optional aqueous acidic pre-clean;
treatment with a β-diketone or β-ketoimine and vacuum removal of any volatile copper species formed during the treatment; and
deposition of capping layer (e.g. by electroless deposition).

Sometimes, an activation layer is deposited prior to deposition of the capping layer. The activation layer may comprise palladium. This is particularly used when the capping layer is prepared using a hypophosphite reducing agent whose electroless deposition is not a self-initiated process. For example, a palladium capping layer is deposited prior to the deposition of a NiMoP or CoWP capping layer.

The inventors have found that this activation layer is subject to oxidation. For palladium, this formation of oxide is not spontaneous but occurs at the elevated temperatures to which the layer is exposed during processing. The inventors have also surprisingly found that the oxide in this capping layer may be removed by the same cleaning process as that described above for the removal of copper oxide from a copper surface (i.e. by using a β-diketone vapour).

If a palladium activation layer is required, it is usually deposited on top of the treated copper surface in the following sequence:
chemical mechanical polishing of an interconnect;
optionally cleaning of the interconnect (e.g. with a β-diketone or β-ketoimine vapour);
deposition of a palladium activation layer;
treatment with a β-diketone and vacuum removal of any volatile palladium species formed during the treatment; and
deposition of capping layer (e.g. by electroless deposition).

Figure 3:
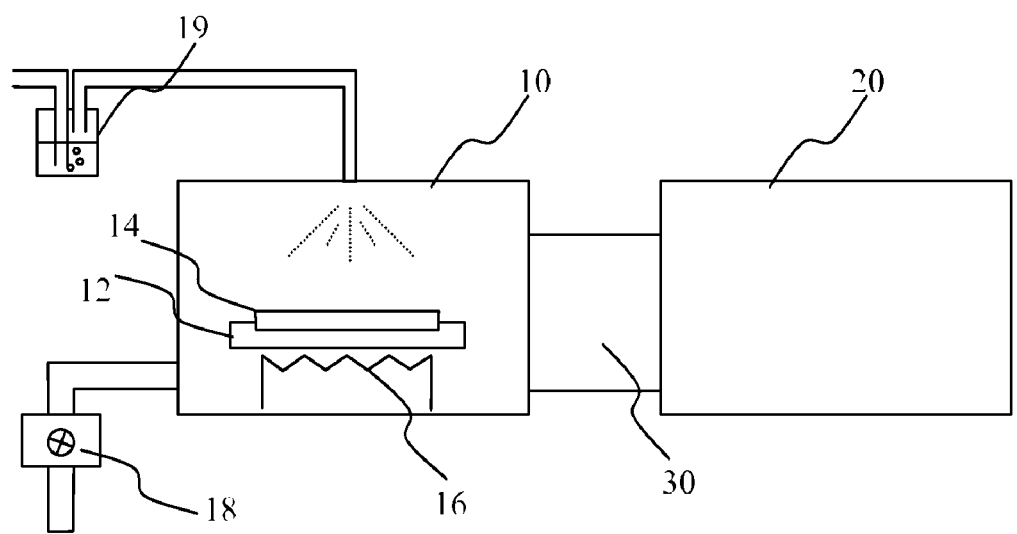
FIG. 3 shows a schematic diagram of an apparatus for carrying out an embodiment of the invention.

The cleaning and electroless deposition processes described above may be carried out in a single dedicated apparatus or tool. For example as shown in FIG. 3, the apparatus may comprise:
a first chamber 10 having a support (such as, a holder or susceptor) 12 to support a substrate 14 and a heater 16 to heat a substrate placed 14 on the support 12,
a vacuum pump 18 associated with said first chamber 10,
a source of β-diketone or β-ketoimine vapour 19, and
a second chamber 20 for carrying out deposition of a capping layer;
the apparatus being adapted so that a substrate may be transferred from said first chamber 10 to said second chamber 20 in a non-oxidizing atmosphere 30.

The source of β-diketone or β-ketoimine vapour 19 may be provided by a bubbler containing a liquid β-diketone or β-ketoimine connected to said first chamber 10. Vapour may be produced by connecting a source of carrier gas to the bubbler and allowing the carrier gas to bubble through the liquid β-diketone or β-ketoimine.

The heater 16 in the first chamber 10 may be adapted to heat the substrate 14 to 100 to 500'C, for example 150 to 400'C, such as 170 to 250'C. The vacuum pump 18 associated with the first chamber 10 may be adapted to create a pressure in the chamber during reaction of 0.01 atm (1 kPa) or less, such as 0.001 atm (0.1 kPa) or less.

The apparatus may further comprise one or more of the following chambers (not shown):
(i) a preclean chamber (for wet treatment of the interconnect prior to exposure to the β-diketone or β-ketoimine);
(ii) a palladium activation chamber for depositing an activation layer prior to the deposition of the capping layer; and
(iii) a chamber for cleaning the interconnect after deposition of the capping layer.

The apparatus may further be configured as a cluster tool.

The apparatus may further comprise a controller (not shown). The controller may comprise instructions that, when executed by the controller, carry out the process of the present invention. These instructions may be carried on, for example, a computer-readable medium.

In the foregoing specification, the invention has been described with reference to specific examples of embodiments of the invention. It will, however, be evident that various modifications and changes may be made therein without departing from the broader scope of the invention as set forth in the appended claims.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A process for forming a capping layer on a conducting interconnect for a semiconductor device, the process comprising:
    (a) providing a substrate comprising one or more conductors in a dielectric layer, the conductors having an oxide layer at their surface;
    (b) exposing the surface of the substrate to a vapour of β-diketone or β-ketoimine without cleaning the surface with an aqueous acidic solution having a pH of 4 or less following formation of the substrate comprising the one or more conductors having the oxide layer at their surface and prior to exposing; and
    (c) depositing a capping layer on the surface of at least some of the one or more conductors.

2. The process of claim 1, wherein the conductor comprises copper.

3. The process of claim 2, wherein the oxide layer comprises an oxide of palladium.

4. The process of claim 2, wherein the β-diketone is 1,1,1,5,5,5-hexafluoroacetylacetone.

5. The process of claim 2, wherein step (b) is carried out in an atmosphere in which the metal is not oxidized.

6. The process of claim 1, wherein the oxide layer comprises an oxide of palladium.

7. The process of claim 6, wherein the β-diketone is 1,1,1,5,5,5-hexafluoroacetylacetone.

8. The process of claim 6, wherein step (b) is carried out in an atmosphere in which the metal is not oxidized.

9. The process of claim 1, wherein the β-diketone is 1,1,1,5,5,5-hexafluoroacetylacetone.

10. The process of claim 1, wherein step (b) is carried out in an atmosphere in which the metal is not oxidized.

11. The method of claim 1, wherein providing a substrate includes providing the substrate following chemical mechanic polishing (CMP) of the substrate.

12. The method of claim 1, wherein exposing the surface of the substrate to a vapour includes exposing the surface to a vapour comprising β-ketoimine.

13. An apparatus for depositing a capping layer on a conducting interconnect, the apparatus comprising:
    a chemical mechanical polishing device;
    a first chamber having a support to support a substrate and a heater to heat a substrate placed on the support,
    a source of β-diketone or β-ketoimine vapour,
    a vacuum pump associated with said first chamber,
    a second chamber for carrying out deposition of a capping layer;
    the apparatus being adapted so that a substrate may be transferred from said first chamber to said second chamber in a non-oxidizing atmosphere; and
    the apparatus being adapted so that the substrate may be transferred from said chemical mechanical polishing device to said first chamber without cleaning with an aqueous acidic solution having a pH of 4 or less.

14. The apparatus according to claim 13, wherein the source of β-diketone or β-ketoimine vapour comprises a bubbler containing a liquid β-diketone or β-ketoimine connected to said first chamber, and a source of carrier gas connected to said bubbler.

15. The apparatus according to claim 14, the apparatus further comprising a controller and instructions associated with the controller, wherein the instructions, when executed by the controller, exposes the surface of a substrate placed in the first chamber of the apparatus to a vapour of β-diketone or a β-ketoimine.

16. The apparatus according to claim 13, the apparatus further comprising a controller and instructions associated with the controller, wherein the instructions, when executed by the controller, exposes the surface of a substrate placed in the first chamber of the apparatus to a vapour of β-diketone or a β-ketoimine.

17. A semiconductor device having conducting interconnects provided with a capping layer obtainable with a process comprising:
    (a) providing a substrate comprising one or more conductors in a dielectric layer, the conductors having an oxide layer at their surface;
    (b) exposing the surface of the substrate to a vapour of β-diketone or β-ketoimine without cleaning the surface with an aqueous acidic solution having a pH of 4 or less following formation of the substrate comprising the one or more conductors having the oxide layer at their surface and prior to exposing; and
    (c) depositing a capping layer on the surface of at least some of the one or more conductors.

18. The device of claim 17, wherein the conductor comprises copper.

19. The device of claim 17, wherein the oxide layer comprises an oxide of palladium.

20. The device of claim 19, wherein step (b) is carried out in an atmosphere in which the metal is not oxidized.

21. The device of claim 17, wherein the β-diketone is 1,1,1,5,5,5-hexafluoroacetylacetone.

22. The device of claim 17, wherein step (b) is carried out in an atmosphere in which the metal is not oxidized.

23. The semiconductor device of claim 17, wherein providing a substrate includes providing the substrate following chemical mechanic polishing (CMP) of the substrate.

24. The semiconductor device of claim 17, wherein exposing the surface of the substrate to a vapour includes exposing the surface to a vapour comprising β-ketoimine.

* * * * *